(12) United States Patent
Ahn et al.

(10) Patent No.: US 8,519,405 B2
(45) Date of Patent: Aug. 27, 2013

(54) THIN FILM TRANSISTOR, ORGANIC LIGHT EMITTING DIODE (OLED) DISPLAY INCLUDING THE SAME, AND MANUFACTURING METHODS OF THEM

(75) Inventors: Ji-Su Ahn, Yongin (KR); Kwang-Nam Kim, Yongin (KR); Jae-Yong Lee, Yongin (KR); Beong-Ju Kim, Yongin (KR); In-Young Jung, Yongin (KR)

(73) Assignee: Samsung Display Co., Ltd., Giheung-Gu, Yongin, Gyeonggi-do (KR)

( * ) Notice: Subject to any disclaimer, the term of this patent is extended or adjusted under 35 U.S.C. 154(b) by 124 days.

(21) Appl. No.: 13/102,234

(22) Filed: May 6, 2011

(65) Prior Publication Data
US 2012/0097966 A1    Apr. 26, 2012

(30) Foreign Application Priority Data
Oct. 21, 2010  (KR) .................. 10-2010-0103072

(51) Int. Cl.
*H01L 27/14*    (2006.01)
(52) U.S. Cl.
USPC ............... 257/72; 257/59; 257/197; 257/222; 257/347; 257/350
(58) Field of Classification Search
None
See application file for complete search history.

(56) References Cited

U.S. PATENT DOCUMENTS
2001/0017371 A1 * 8/2001 Tanaka et al. .............. 257/59
2008/0198288 A1 * 8/2008 Nakahori et al. .......... 349/46

FOREIGN PATENT DOCUMENTS
KR    10-0659125    12/2006
KR    10-082216    4/2008

* cited by examiner

*Primary Examiner* — Kyoung Lee
(74) *Attorney, Agent, or Firm* — Robert E. Bushnell, Esq.

(57) ABSTRACT

The present invention relates generally to a thin film transistor, an organic light emitting diode (OLED) display including the same, and manufacturing methods of them. The thin film transistor comprises: a substrate; a gate electrode disposed on the substrate; a gate insulating layer disposed on the gate electrode; a semiconductor layer disposed on the gate insulating layer; an inter layer dielectric disposed on the entire surface of the substrate; and source and drain electrodes disposed on the inter layer dielectric and connected to the semiconductor layer, and in which the gate electrode is disposed so as to correspond to the entire surface of the semiconductor layer, and a manufacturing method thereof. The organic light emitting diode (OLED) display comprises the elements of the thin film transistor described above, and also includes an insulating film disposed on the entire surface of the substrate, and a first electrode, an organic layer, and a second electrode disposed on the insulating film, the first electrode being electrically connected to any one of the source and drain electrodes, and the gate electrode is disposed so as to correspond to the entire surface of the semiconductor layer.

22 Claims, 3 Drawing Sheets

THIN FILM TRANSISTOR, ORGANIC LIGHT EMITTING DIODE (OLED) DISPLAY INCLUDING THE SAME, AND MANUFACTURING METHODS OF THEM

CLAIM OF PRIORITY

This application makes reference to, incorporates the same herein, and claims all benefits accruing under 35 U.S.C. §119 from an application earlier filed in the Korean Intellectual Property Office on 21 Oct. 2010 and there duly assigned Serial No. 10-2010-0103072.

BACKGROUND OF THE INVENTION

1. Field of the Invention

The present invention relates generally to a thin film transistor, a manufacturing method thereof, and a manufacturing method of an organic light emitting diode (OLED) display including the same, and provides a method capable of minimizing element defects by attaining arc prevention by performing a Joule-heating-based crystallization process using application of an electric field through a gate electrode metal and capable of improving production yield in an effective manner.

2. Description of the Related Art

In general, there are various heat treatment methods, including furnace annealing using a heat treating furnace, rapid thermal annealing (RTA) using radiant heat of a halogen lamp or the like, laser annealing using a laser, a heat treatment method using Joule heating, etc. These heat treatment methods are selected as appropriate for characteristics of materials and processes according to a temperature range of the heat treatment, uniformity of the heat treatment temperature, rate of temperature rise, cooling rate, purchase price, cost of maintenance, etc. Particularly, in cases where a high-temperature heat treatment is required or a high-speed heat treatment on a local area of a material is necessary due to the characteristics of the material and a process, selectable heat treatment methods are fairly limited.

Among the above-mentioned heat treatment methods, the laser annealing method is capable of a high-speed heat treatment on a surface of a material. However, since a determination as to whether or not a heat treatment is possible or not is made according to the wavelength of the laser and the kinds of materials requiring the heat treatment, materials on which the heat treatment can be performed is limited. Particularly, in the case of performing a heat treatment on a large area, since scanning should be performed by overlapping line beam types of lasers with each other, problems, such as non-uniformity of laser beam intensities, non-uniformity of an irradiation amount of a laser beam with time, etc., occur. Also, there is a drawback in that not only the cost of equipment, but also the cost of maintenance, are very high.

The RTA method is widely used in semiconductor manufacturing processes. However, it is applicable only to silicon wafers having a diameter of 300 mm in current technology, and it has a limit in performing a uniform heat treatment on substrates larger than that. Also, the maximum rate of temperature rise of the heat treatment is 400° C./sec, and thus the RTA method cannot be used in a process requiring a rate of temperature rise larger than 400° C./sec.

Therefore, much research on heat treatment methods capable of solving the problems and breaking free from restrictions of processes has been conducted. Among the methods, there is a high-speed heat treatment method in which Joule heating is performed by applying an electric field to a conductive layer. The heat treatment method can rapidly and selectively heat-treat a desired material by heat conduction of generated high heat, and can be expected to have a rate of temperature rise higher than the rate of temperature rise of an RTA process. However, the process has a drawback in that the process becomes complicated since a metal film for applying an electric field should be additionally formed.

The above information disclosed in this Background section is only for enhancement of an understanding of the background of the described technology, and therefore it may contain information which does not form the prior art which is already known in this country to a person of ordinary skill in the art.

SUMMARY OF THE INVENTION

The present invention has been developed in an effort to provide a manufacturing method of a thin film transistor which includes a light shielding film formed by using a metal for electrodes used in an element and a semiconductor layer crystallized by applying an electric field, and a manufacturing method of an organic light emitting diode (OLED) display including the same having the advantages of preventing arc occurrence during crystallization by bringing a metal film into direct contact with the semiconductor layer, performing crystallization by effective heat conduction, and improving yield by simplifying the process.

The present invention relate to a thin film transistor, an organic light emitting diode (OLED) display including the same, and manufacturing methods of them. Exemplary embodiments of the invention provide a thin film transistor which includes: a substrate; a gate electrode disposed on the substrate; a gate insulating layer disposed on the gate electrode; a semiconductor layer disposed on the gate insulating layer; an inter layer dielectric disposed on the entire surface of the substrate; and source and drain electrodes disposed on the inter layer dielectric and connected to the semiconductor layer, and in which the gate electrode is disposed so as to correspond to the entire surface of the semiconductor layer. The invention also relates to a manufacturing method thereof.

Other exemplary embodiments of the invention provide an organic light emitting diode (OLED) display which includes: a substrate; a gate electrode disposed on the substrate; a gate insulating layer disposed on the gate electrode; a semiconductor layer disposed on the gate insulating layer; an inter layer dielectric disposed on the entire surface of the substrate; source and drain electrodes disposed on the inter layer dielectric and connected to the semiconductor layer; an insulating film disposed on the entire surface of the substrate; and a first electrode, an organic layer, and a second electrode disposed on the insulating film, the first electrode being electrically connected to any one of the source and drain electrodes, and in which the gate electrode is disposed so as to correspond to the entire surface of the semiconductor layer. The invention also relates to a manufacturing method thereof.

According to the exemplary embodiments of the invention, since an electric field is applied to a thin film for the gate electrode so as to crystallize an amorphous silicon layer into a polycrystalline silicon layer when an electrode is formed, it is possible to solve the problem of an arc occurring when a polycrystalline silicon is manufactured by Joule heating according to the related art. Furthermore, since a gate electrode effectively shielding light is formed by patterning without a separate process after the crystallization, it is possible to simplify the process and improve the yield.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

FIGS. 1A thru 1E are diagrams illustrating a thin film transistor according to an exemplary embodiment of the invention.

Figure 1A:
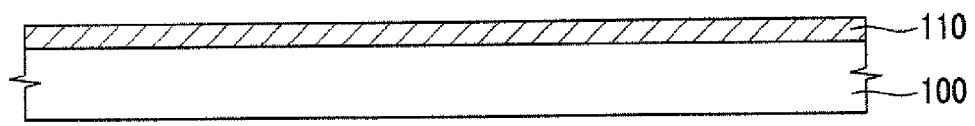
FIGS. 1A thru 1E are diagrams illustrating a thin film transistor according to an exemplary embodiment of the invention.

Referring to FIG. 1A, a buffer layer 110 is formed on a substrate 100, such as glass or plastic. The buffer layer 110 is formed as a single layer or a multi-layer using insulating layers, such as a silicon oxide layer and a silicon nitride layer, by using a chemical vapor deposition method or a physical vapor deposition method. The buffer layer 110 may be formed as a multi-layer of a silicon nitride layer and a silicon oxide layer such that a metal catalyst can be easily diffused.

Figure 1B:
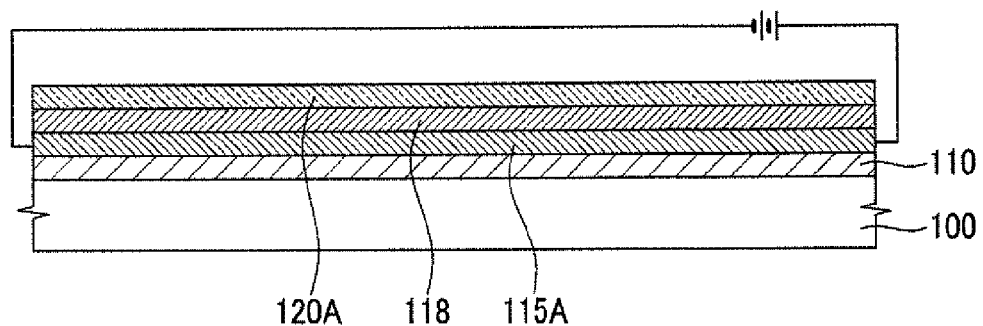

Then, referring to FIG. 1B, a metal film 115A for a gate electrode is formed on the buffer layer 110 and over the entire surface of the substrate 100. In this case, the metal film 115A for the gate electrode is formed as a single layer of aluminum (Al) or an aluminum alloy such as aluminum-neodymium (Al—Nd), or as a multi-layer in which an aluminum alloy is stacked on a chromium (Cr) or molybdenum (Mo) alloy.

Next, a gate insulating layer 118 is formed on the metal film 115A and over the entire surface of the substrate 100. In this case, the gate insulating layer 118 may be a silicon oxide layer, a silicon nitride layer, or a double-layer of them.

Thereafter, an amorphous silicon layer 120A is formed on the gate insulating layer 118 and over the entire surface of the substrate, and then the amorphous silicon layer 120A is crystallized by applying an electric field to the metal film 115A as a gate electrode.

In this case, the metal film 115A as the gate electrode is formed so as to have a thickness of about 50 nm to about 300 nm. The reason is that, if the metal film 115A is formed so as to be thinner than about 50 nm, the metal film 115A for gate electrode is formed non-uniformly such that heat conduction is not uniform, resulting in non-uniform crystallization, and when gate electrode is formed by patterning after crystallization, the thickness equal to or less than about 300 nm is reasonable so as to serve as electrodes, and is an appropriate thickness for a thin film element.

Then, in order to preferably make the crystallization progress, an electric field of about 100 V/cm$^2$ to about 10000 V/cm$^2$ is applied for about 1 μs to about 1 sec. The reason is that an electric field lower than about 100 V/cm$^2$ generates Joule heat insufficient to perform the crystallization, and an electric field higher than about 10000 V/cm$^2$ generates a local arc. Another reason is that, if the electric field is applied for a period shorter than about 1 μs, it is difficult to perform the crystallization due to insufficient Joule heat, and if the electric field is applied for a period longer than about 1 sec, the substrate may be bent or a defect in the crystallization of the edge caused by heat conduction may occur so as to have a bad influence on an element.

Figure 1C:
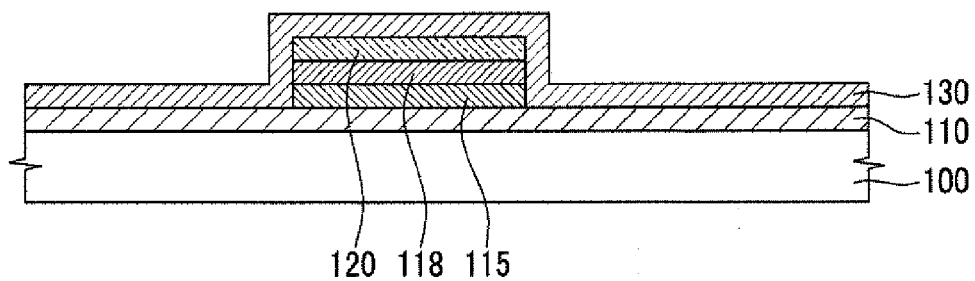

Next, referring to FIG. 1C, patterning is performed on the crystallized amorphous silicon layer 120A so as to form a semiconductor layer 120 which is composed of a polycrystalline silicon layer. In this case, the patterning is performed by using a halftone mask, and the metal film 115 as the gate electrode and the gate insulating layer 118 are also patterned at the same time.

Figure 1D:
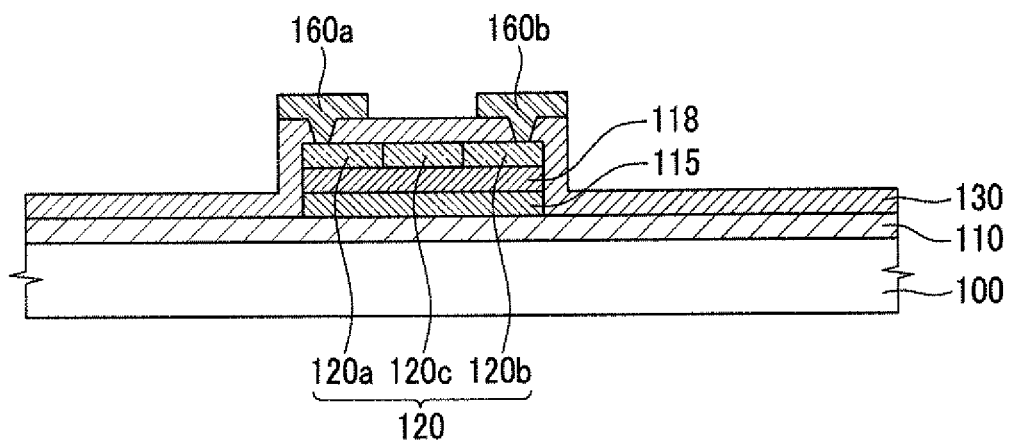
Figure 1E:
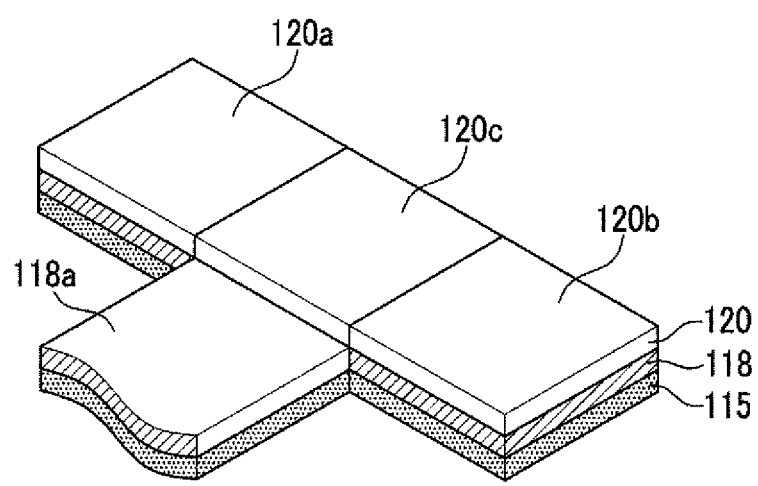

Then, the metal film 115 for the gate electrode and the gate insulating layer 118 are patterned at the same time as the semiconductor layer 120 so as to correspond to the entire lower surface of the semiconductor layer 120 (seen in FIG. 1E). Also, patterning is performed by using a halftone mask such that a pattern 118a (FIG. 1E) extending from a part corresponding to a lower part of a channel region 120c of the semiconductor layer 120 remains, which makes it possible to form an element applicable to a backplane.

Next, the source region 120a and the drain region 120b of the semiconductor layer 120 are doped with ions, such as n-type impurities or p-type impurities, so as to complete the channel region 120c and the source and drain regions 120a and 120b, respectively, of the semiconductor layer 120.

Then, referring to FIG. 1C, an inter layer dielectric 130 is formed over the entire surface of the substrate.

Next, referring to FIG. 1D, source electrode 160a and drain electrode 160b are formed so as to be electrically connected to the source region 120a and drain region 120b of the semiconductor layer 120.

In this case, the source and drain electrodes 160a and 160b, respectively, may be made of molybdenum (Mo), chromium (Cr), tungsten (W), molybdenumtungsten (MoW), aluminum (Al), aluminum-neodymium (Al—Nd), titanium (Ti), titanium nitride (TiN), copper (Cu), molybdenum alloys (Mo alloys), aluminum alloys (Al alloys), or copper alloys (Cu alloys).

Therefore, the thin film transistor according to the exemplary embodiment is completed by the method as described above.

Figure 2:
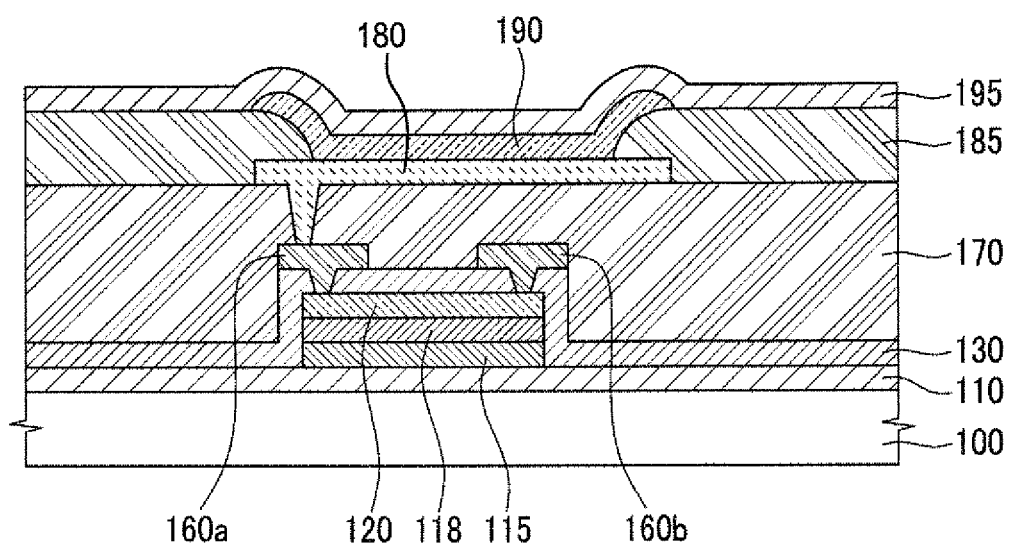
FIG. 2 is a diagram illustrating an organic light emitting diode (OLED) display according to an exemplary embodiment of the invention.

FIG. 2 is a diagram illustrating an organic light emitting diode (OLED) display according to an exemplary embodiment of the invention.

The organic light emitting diode (OLED) display according to FIG. 2 has the thin film transistor shown in FIGS. 1A to 1E, and in order to avoid repetition, a repetitive description of the parts thereof is omitted.

An insulating film 170 is formed over the entire surface of the substrate 100, including the gate electrode 115, the semiconductor layer 120, and the source and drain electrodes 160a and 160b, respectively, as described above.

Then, a first electrode 180 is formed on the insulating film 170 so as to be connected to any one of the source and drain electrodes 160a and 160b, respectively.

Next, a pixel defining layer 185 is formed on the first electrode 180 so as to define a pixel, and an organic layer 190 including an organic light emission layer is formed on the first electrode 180.

Then, a second electrode 195 is formed over the entire surface of the substrate 100 so as to complete the organic light emitting diode (OLED) display according to the exemplary embodiment of the invention.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the Happended claims.

What is claimed is:

1. A thin film transistor, comprising:
a substrate;
a gate electrode disposed on the substrate;
a gate insulating layer disposed on the gate electrode;
a semiconductor layer disposed on the gate insulating layer;
an inter layer dielectric disposed on an entire surface of the substrate; and
source and drain electrodes disposed over the inter layer dielectric, and connected to the semiconductor layer;
wherein the gate electrode and the gate insulation layer are disposed so as to correspond precisely to an entire surface of the semiconductor layer.

2. The thin film transistor of claim 1, wherein the semiconductor layer has source and drain regions which are doped with impurities.

3. The thin film transistor of claim 1, wherein the gate electrode is one of a single layer and a multi-layer, and comprises any one of aluminum (Al), aluminum alloys, chromium alloys, and molybdenum alloys.

4. The thin film transistor of claim 1, wherein the semiconductor layer is a polycrystalline silicon layer formed by Joule heating.

5. The thin film transistor of claim 1, wherein a thickness of the gate electrode is in a range of about 50 nm to about 300 nm.

6. A manufacturing method of a thin film transistor, comprising the steps of:
providing a substrate;
forming a metal film as a gate electrode on the substrate;
forming a gate insulating layer on the metal film as the gate electrode;
forming an amorphous silicon layer over an entire surface of the gate insulating layer;
forming a polycrystalline silicon layer by crystallizing the amorphous silicon layer by applying an electric field to the metal film as the gate electrode;
forming a semiconductor layer by patterning the polycrystalline silicon layer;
forming an inter layer dielectric over an entire surface of the substrate; and
forming source and drain electrodes which are connected to the semiconductor layer;
wherein the metal film as the gate electrode is patterned so as to form the gate electrode when the semiconductor layer is patterned.

7. The method of claim 6, wherein source and drain regions of the semiconductor layer are doped with impurities.

8. The method of claim 6, wherein the gate electrode, the gate insulating layer, and the semiconductor layer are formed at the same time by patterning.

9. The method of claim 8, wherein the patterning is performed by using a halftone mask.

10. The method of claim 6, wherein the crystallizing of the amorphous silicon layer is performed by applying an electric field in a range of about 100 V/cm$^2$ to about 10000 V/cm$^2$ to the metal film as the gate electrode.

11. The method of claim 6, wherein the gate electrode is patterned so as to correspond to an entire lower surface of the semiconductor layer such that a pattern extending from a part corresponding to a lower part of a channel region of the semiconductor layer remains.

12. An organic light emitting diode (OLED) display, comprising:
a substrate;
a gate electrode disposed on the substrate;
a gate insulating layer disposed on the gate electrode;
a semiconductor layer disposed on the gate insulating layer;
an inter layer dielectric disposed over an entire surface of the substrate;
source and drain electrodes disposed on the inter layer dielectric, and connected to the semiconductor layer;
an insulating film disposed over the entire surface of the substrate; and
a first electrode, an organic layer, and a second electrode disposed on the insulating film, the first electrode being electrically connected to any one of the source and drain electrodes;
wherein the gate electrode and the gate insulation layer are disposed so as to correspond precisely to an entire surface of the semiconductor layer.

13. The organic light emitting diode (OLED) display of claim 12, wherein source and drain regions of the semiconductor layer are doped with impurities.

14. The organic light emitting diode (OLED) display of claim 12, wherein the gate electrode is one of a single layer and a multi-layer, and comprises any one of aluminum (Al), aluminum alloys, chromium alloys, and molybdenum alloys.

15. The organic light emitting diode (OLED) display of claim 12, wherein the semiconductor layer is a polycrystalline silicon layer formed by Joule heating.

16. The organic light emitting diode (OLED) display of claim 12, wherein a thickness of the gate electrode is in a range of about 50 nm to about 300 nm.

17. A manufacturing method of an organic light emitting diode (OLED) display, comprising the steps of:
providing a substrate;
forming a metal film as a gate electrode on the substrate;
forming a gate insulating layer on the metal film as the gate electrode;
forming an amorphous silicon layer on an entire surface of the gate insulating layer;
forming a polycrystalline silicon layer by crystallizing the amorphous silicon layer by applying an electric field to the metal film as the gate electrode;
forming a semiconductor layer by patterning the polycrystalline silicon layer;
forming an inter layer dielectric on an entire surface of the substrate;
forming source and drain electrodes connected to the semiconductor layer;
forming an insulating film on the entire surface of the substrate; and
forming a first electrode, an organic layer, and a second electrode positioned on the insulating film, the first electrode being electrically connected to any one of the source and drain electrodes;
wherein the metal film for the gate electrode is patterned so as to form the gate electrode when the semiconductor layer is patterned.

18. The method of claim 17, wherein source and drain regions of the semiconductor layer are doped with impurities.

19. The method of claim 17, wherein the gate electrode, the gate insulating layer, and the semiconductor layer are formed at the same time by patterning.

20. The method of claim 19, wherein the patterning is performed by using a halftone mask.

21. The method of claim 17, wherein the crystallizing of the amorphous silicon layer is performed by applying an electric field in a range of about 100 V/cm$^2$ to about 10000 V/cm$^2$ to the metal film for the gate electrode.

22. The method of claim 17, wherein the gate electrode is patterned so as to correspond to an entire lower surface of the semiconductor layer such that a pattern extending from a part corresponding to a lower part of a channel region of the semiconductor layer remains.

* * * * *